US007632717B2

(12) United States Patent
Crispell et al.

(10) Patent No.: US 7,632,717 B2
(45) Date of Patent: Dec. 15, 2009

(54) PLASTIC OVERMOLDED PACKAGES WITH MECHANCIALLY DECOUPLED LID ATTACH ATTACHMENT

(75) Inventors: Robert B. Crispell, Whitehall, PA (US); Robert Scott Kistler, Palmerton, PA (US); John W. Osenbach, Kutztown, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/228,720

(22) Filed: Aug. 15, 2008

(65) Prior Publication Data

US 2008/0311700 A1 Dec. 18, 2008

Related U.S. Application Data

(62) Division of application No. 11/505,152, filed on Aug. 16, 2006, now Pat. No. 7,423,341.

(51) Int. Cl.
*H01L 21/00* (2006.01)
*H01L 23/12* (2006.01)
*H05K 7/20* (2006.01)

(52) U.S. Cl. .............. 438/122; 257/704; 257/707; 257/713; 257/724; 257/E23.103; 361/709; 361/711

(58) Field of Classification Search .............. None
See application file for complete search history.

(56) References Cited

U.S. PATENT DOCUMENTS

| 6,535,388 | B1 * | 3/2003 | Garcia ................... 361/704 |
| 7,315,080 | B1 * | 1/2008 | Fan et al. ................ 257/717 |
| 7,332,823 | B2 * | 2/2008 | Khaw et al. ............. 257/787 |
| 7,423,341 | B2 * | 9/2008 | Crispell et al. .......... 257/704 |
| 2005/0161780 | A1 * | 7/2005 | Wang et al. ............. 257/678 |
| 2007/0158823 | A1 * | 7/2007 | Dani et al. .............. 257/712 |

FOREIGN PATENT DOCUMENTS

JP          06132425 A  *  5/1994

* cited by examiner

*Primary Examiner*—Alonzo Chambliss

(57) ABSTRACT

The specification describes a lidded MCM IC plastic overmolded package with a chimney-type heat sink. The lid is mechanically decoupled from the chimneys by a compliant conductive polymer plug.

9 Claims, 5 Drawing Sheets

PLASTIC OVERMOLDED PACKAGES WITH MECHANCIALLY DECOUPLED LID ATTACH ATTACHMENT

RELATED APPLICATIONS

This application is a Division of application Ser. No. 11/505,152, filed Aug. 16, 2006 now U.S. Pat. No. 7,423,341. This application is related to application Ser. No. 11/504,989 filed of even date herewith.

FIELD OF THE INVENTION

This invention relates to plastic overmolded packages for integrated circuit (IC) and related devices, and more specifically to plastic overmolded packages requiring aggressive thermal management.

BACKGROUND OF THE INVENTION

A widely used form of packaging for electronic devices such as IC devices is a plastic housing. Typically, IC chips are bonded to a substrate and a polymer is molded over the assembly to overmold the device. It is common for two or more IC chips to be assembled in a single overmolded package. Multiple chip packages are referred to as multi-chip-modules (MCMs).

As chip size decreases in state of the art IC technology, the problem of overheating in IC packages becomes more severe. It is further aggravated because polymers used for overmolding are poor thermal conductors. Thus while the plastic effectively encapsulates the devices, it traps the heat generated by the devices as well. In packages in which the IC chip is connected to the electrical terminations of the package with wire bonds, the thickness of the encapsulant must be sufficient to accommodate the height of the wire bonds. This results in a thick "cover" of plastic over the device. Since the thermal resistance of any given material decreases with increasing thickness, increased thickness further retards heat dissipation, all else being constant.

A wide variety of heat sink expedients have been proposed and used to address thermal management issues. Among these, and tailored for the types of packages with wire bonded IC chips, is the use of a conductive "chimney" that attaches to the top of an IC chip and becomes imbedded in the plastic overmold. The conductive chimney conducts heat away from the IC chip, through the thickness of the plastic overmold but through the chimney itself and not the plastic overmolded material to the top of the package. In some package designs, the top of the chimney is affixed to a lid. The lid may be made of metal, which effectively spreads the heat and conducts the heat to the external environment. In conventional designs, the chimney is attached to the lid using a thermal interface material (TIM). While any heat conductive material may be used for the chimney structure, silicon is preferred because of its thermo-mechanical compatibility with the silicon chips, low cost, availability, compatibility with existing IC assembly equipment, and good thermal conductivity.

Device failures have been identified in these package designs. Improvement in the package design is needed to overcome these failures.

BRIEF STATEMENT OF THE INVENTION

We have studied the failure modes of IC devices with chimney-type heat sinks, and have identified in detail the causes and effects of the failures. The two most common failure modes in these packages are resultant from the breakdown in the mechanical integrity of the chimney stack: i) the loss of attachment of the lid to the silicon chimney via the breakdown of the TIM/lid or TIM/chimney interface; and ii) the loss of attachment of the silicon chimney to the IC device via the breakdown of the chimney-IC adhesive/chimney or chimney-IC adhesive/IC device interface. When this attachment fails, the thermal conductive path from the IC chip to the external ambient is compromised. Among the reasons for detachment, a main cause is thermo-mechanical stress. When thermo-mechanical stresses become excessive, the lid detaches from the chimney or the chimney detaches from the IC device. We have developed an effective approach to reducing the adverse effects of thermo-mechanical stresses, and improving the thermo-mechanical stability of these IC packages. Important to the improved package designs is the recognition that the lid should be at least partially decoupled mechanically from the chimney while maintaining intimate thermal coupling. This is counter-intuitive to the tendency to approach the problem by making the bond between the chimney and the lid more mechanically robust, and consequently more rigid. The improvements basically rely on eliminating robust adhesive bonding between the chimney stack and the lid and substituting a pliant conductive polymer cushion that allows relative movement between the chimney stack and the lid.

BRIEF DESCRIPTION OF THE DRAWING

The invention may be better understood when considered in conjunction with the drawing in which.

DETAILED DESCRIPTION OF THE INVENTION

Figure 1:
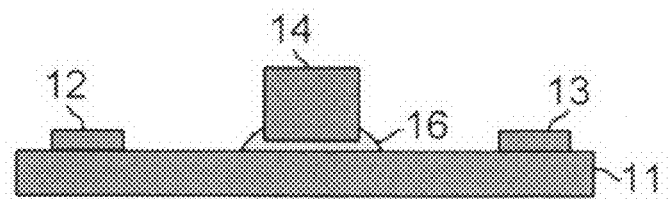
FIGS. 1-4 are schematic views of a typical step sequence for fabricating an overmolded IC device package with a chimney-type heat sink.
Figure 2:
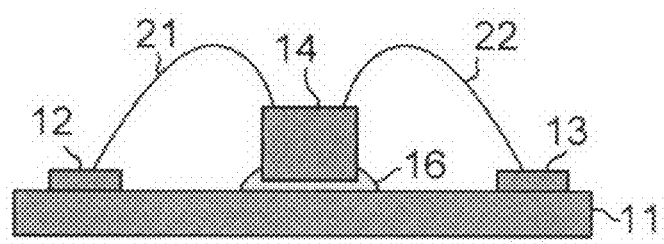
Figure 3:
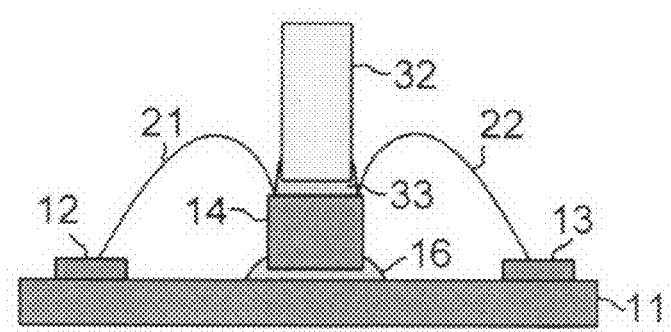

FIG. 1 shows an IC chip package comprising IC chip 14 bonded to substrate 11 with die attach material 16. The substrate may be any suitable substrate material, but is typically a printed circuit board (PCB). Wire bond pads 12 and 13 are formed on the substrate in known fashion. Referring to FIG. 2, wire bonds 21 and 22 are shown electrically connecting the bonded IC chip 14 to the PCB. A variety of IC chips generate significant heat during operation, and require special types of heat sinking to avoid overheating and failure. For example, microprocessors are typically large IC chips fabricated with state of the art design rules and have very dense device packing. They pose severe thermal management issues, and consequently are usually provided with special heat sink arrangements. One of those is shown in FIG. 3 with the heat sink in the form of silicon chimney 32. In this type of package, the IC chip is usually mounted on the PCB, and wire bonded for electrical interconnection. The wire bonds are attached to edge arrays of bond pads (not shown, for clarity) on the IC chip. This leaves a space in the center of the chip where the silicon chimney is mounted. The silicon chimney may be attached to the IC chip using a suitable attachment material 33. Attachment materials include but are not limited to, adhesives, such as epoxies or other adhesive polymer materials or solders. It is preferred that the adhesive material be a thermally conductive adhesive. Many standard and commercially available electrically conductive adhesives are also effective conductors of heat.

The example shown is a die bonded and wire bonded device. Other forms of IC devices, for example, flip-chip IC devices, may be used alternatively. The IC chips are typically encapsulated, but could comprise bare die. Reference to IC chip is meant to include either form. In the wire bonded example shown, the height of the silicon chimney is sufficient to accommodate the height of the wire bonds. The chimney height may be taller, or, in the case of devices without wire bonds, shorter. Silicon chimneys are usually designed for wire bonded IC chip packages.

Figure 4:
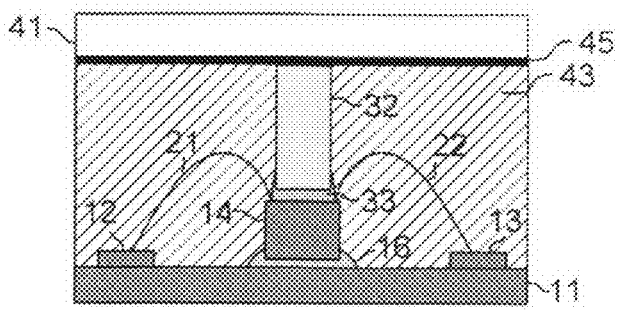

With reference to FIG. 4, the assembly is then encapsulated in a polymer overmold 43. This protects the IC chip, the printed circuits on the surface of the PCB, and the wire bonds. A Thermal Interface Material (TIM) 45 is then applied to the overmold, and lid 41 attached to complete the device. The TIM serves both as a conductive medium, to conduct heat from silicon chimney 32 to lid 41, as well as an adhesive for retaining the lid in place. A suitable TIM for this application is Ablebond 2000T$^R$, available from Ablestick Corp. The lid 41 serves as a heat spreader and conducts heat both laterally to cooler portion of the lid located away from the silicon chimney, as well as conduction and radiation to the ambient or other system designed heat dissipation structures. The lid is composed of thermally conductive material, such as copper. Typical thickness range for the lid is 0.1 mm to 1.0 mm.

Figure 5:
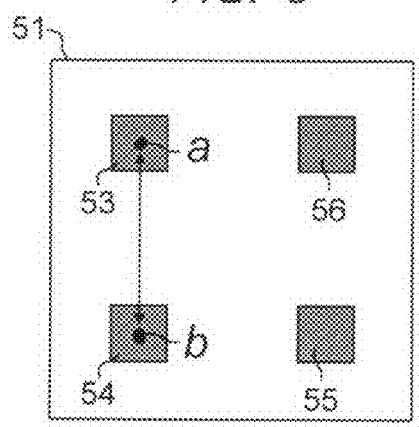
FIGS. 5 and 6 are plan views of an MCM package of four IC chips and four chimneys that are used in this description to illustrate applicants' recognition of the failure mode in these devices.

FIG. 5 is a schematic representation in plan view of an MCM 51 with four IC devices and four silicon chimneys, 53, 54, 55, 55 arranged as shown at four corners of a square. This figure is but one example of a variety of MCM device configurations and arrangements, having fewer or more devices and chimneys.

Figure 6:
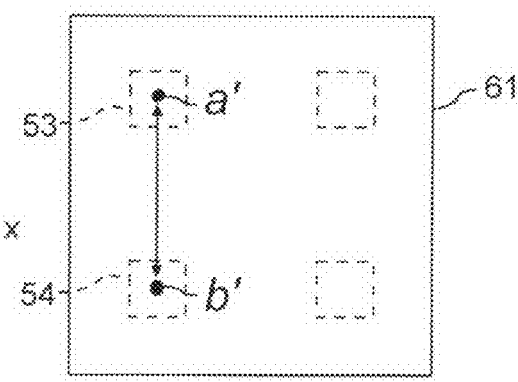

Chimneys 53 and 54 are spaced, center-to-center, at nominal distance a-b. When the MCM module is operated, and thermally cycled under different operating conditions, for example on and off, the distance a-b will change due to expansion/contraction of the various elements in the IC package. When a lid such as 61 is attached to the top of the chimneys, as shown in FIG. 6, the tops of the chimneys are coupled to both the lid and the substrate, such that differential stresses due to any movement that changes distance a-b is experienced by the chimney stack and chimney/lid interface. For example, if lid 61 is copper, a material commonly used for lids in packages of this kind, and the package subjected to significant temperature changes, the copper lid will undergo expansion/contraction dictated by the thermal coefficient of expansion, $T_c$, of copper. The distance a'-b' is determined by that property, a property typically different from those that determine distance a-b. Thus the mismatch between a-b and a'-b' can, depending on the thermo-mechanical properties of the materials used in the package construction, cause significant shear and bending stresses in the package. These tend to impact the interface between the chimney and the lid and the chimney and the IC device. In severe cases this will cause the lid to detach from the package, or the chimney to detach from the IC.

Figure 7:
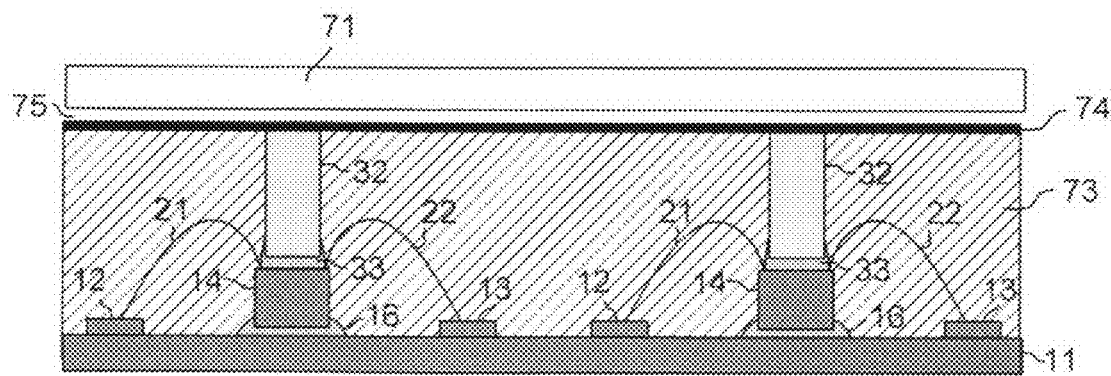
FIGS. 7 and 8 are side views of an MCM package showing detachment modes wherein the lid separates from the chimneys, or causes failure in the bond between the chimneys and the IC chips.

Detachment often occurs between the TIM and the lid. The TIM adheres well to the silicon chimney, but less firmly to the lid. FIG. 7 shows space 75 developing between the lid 71 and the TIM 74.

Figure 8:
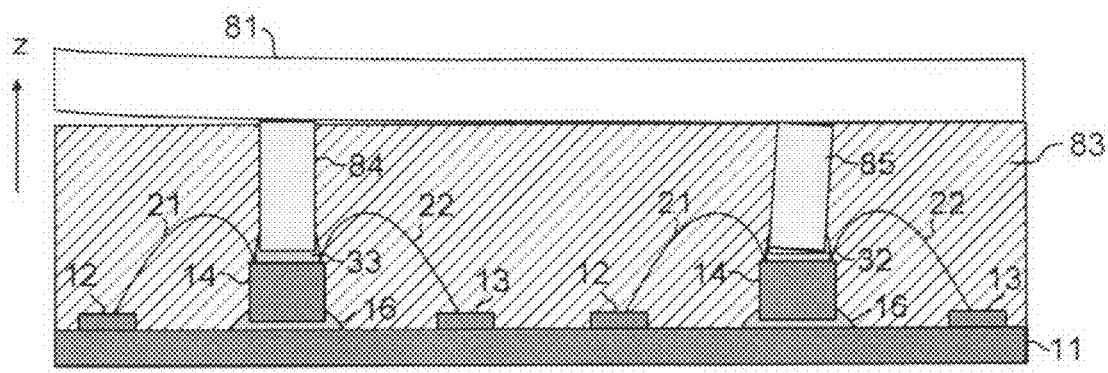

Strains produced by differential out of plane strains, and bending moments, lead to either or both lid failure and chimney to IC device failure. These are illustrated in FIG. 8: In lid failure, the silicon chimney 84 on the left side of the figure is raised with respect to the silicon chimney 85 on the right side of the figure. This disparity may be the result of differences in the expansion of the chimneys, or in other elements of the package. The out of plane strains may be sufficient to cause the lid 81 to completely or partially detach from encapsulant 83 (the TIM is omitted in this figure, for clarity). The out of plane strains like that illustrated in FIG. 8 may also cause a bending moment on the silicon chimney. Intuitively it can be appreciated that as the lid lifts on the left side in the figure (where it may be detached from the silicon chimney 84), it tilts. This imposes a bending moment on chimney 85, and may cause failure of the attachment at 33, i.e. the attachment between the chimney and the IC chip.

An approach to a more robust connection between the chimney heat sinks and the lid would appear to be to increase the integrity of the adhesive bond between these elements. However, we have found that a more effective approach is just the opposite. The rigid attachment between these elements is found to be at least partly responsible for the problem of lid failure. Accordingly, new package structures have been designed wherein the lid and the chimney stack are mechanically decoupled. The interface between these elements, normally filled with a strong bonding adhesive, is filled with a soft conductive polymer. This interface filler is sufficiently compliant and spongy, that strains caused by the factors described above are easily absorbed and not translated to the lid.

Figure 9:
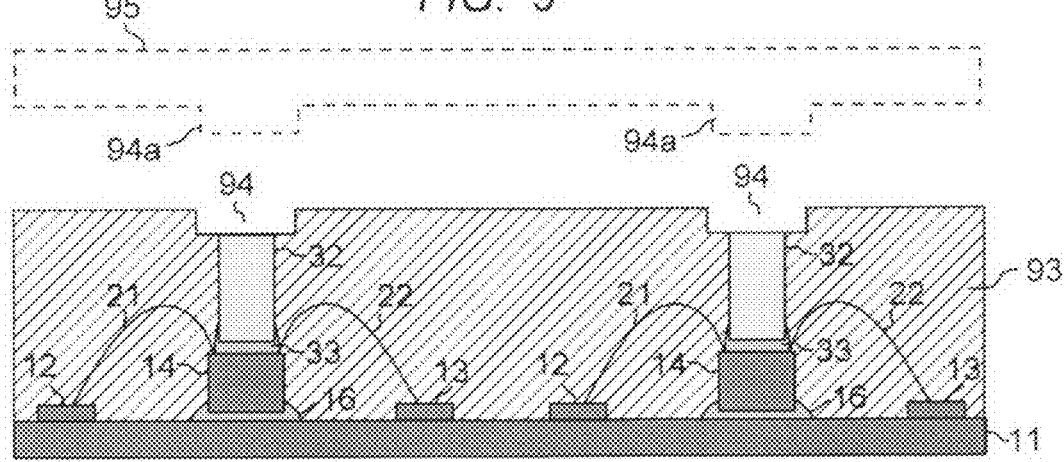
FIGS. 9-12 illustrate steps, according to one embodiment, for assembling an overmolded package with mechanical decoupling between the chimneys and the lid.

One embodiment of the invention is illustrated by FIGS. 9-12. These figures show a sequence of steps for implementing this embodiment. FIG. 9 shows the step of molding the overmold 93. The form for this molding operation 95 is provided with protrusions 94a. These, protrusions are aligned with the tops of the chimneys 32, and after the overmold polymer is applied, and the mold is released, cups 94 are created in the top of the overmold 93. The cups align with the chimney tops as shown. The overmold material may be chosen from a wide variety of polymers. Suitable materials are available from Cookson Electronics, Alpharetta, Ga. Typically these are thermosetting resins, and are relatively rigid after curing. Cured epoxy materials typically have glass transition temperatures, $T_g$, above 100° C.

Figure 10:
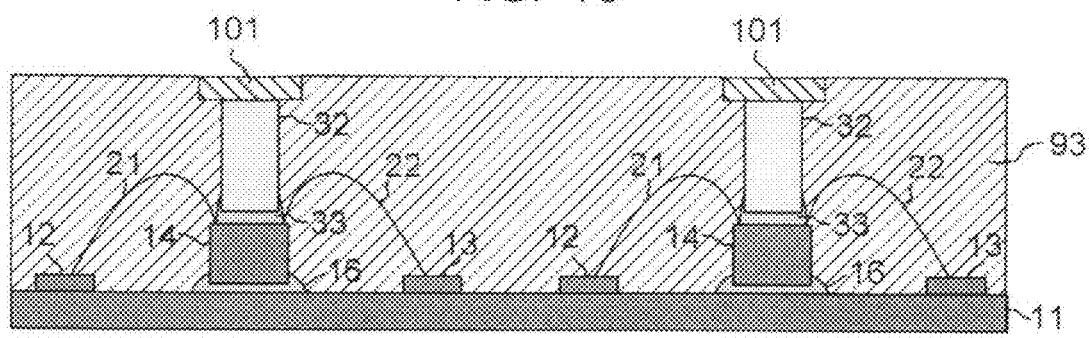

Referring to FIG. 10, the cups are filled with mechanical buffers, which preferably are plugs of soft conductive polymer 101. The plugs 101 mechanically decouple the chimneys 32 from the lid that is applied later. The conductive polymer may also be chosen from a wide variety of materials. A suitable choice is a silicone gel, for example, Gelease™, available from Lord Corporation, Cary, N.C. This material has a $T_g$ of −121° C., and a thermal conductivity of 2.3 watts per meter Kelvin (W/mK), which is about 10 times the thermal conductivity of normal plastics (0.2 W/mK). For the purpose of this invention it is recommended that the thermally conductive polymer have a thermal conductivity greater than 0.7 W/mK, and have an elastic modulus and glass transition temperature lower than that of the overmold compound.

Figure 11:
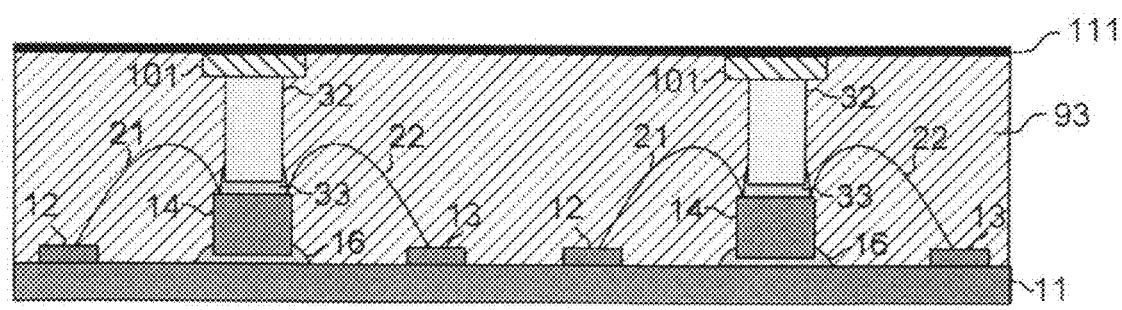
Figure 12:
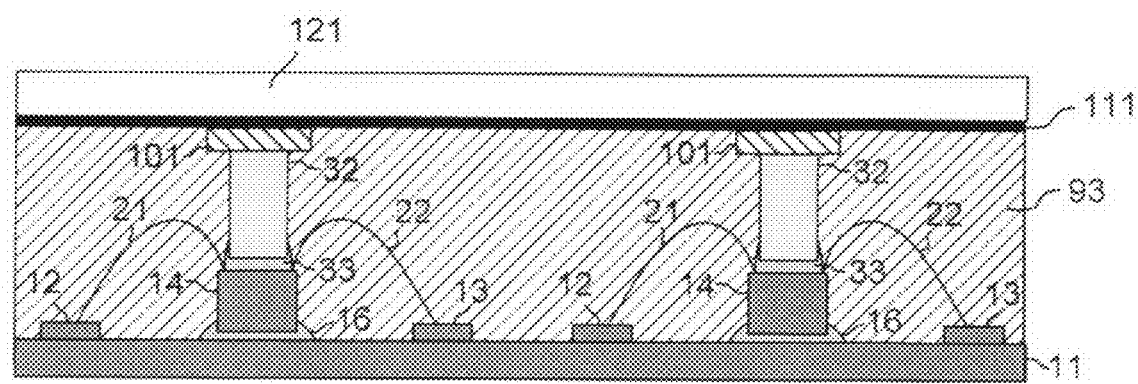

After application of the conductive plugs 101, the top surface of the assembly may be coated with a TIM. The TIM may be selected from a variety of materials, such as epoxy adhesives, for attaching the lid to the package top. A suitable TIM for this application is Ablebond™ 2000T, available from Ablestik Co. This material has a room temperature modulus of 1700 MPa, and a thermal conductivity of 2.7 W/mK. FIG. 11 shows a layer of TIM 111, blanket applied to the surface of the overmold 93. The TIM layer 111 may be applied in the form of a paste, gel, or film. A lid 121 is shown applied to the TIM layer in FIG. 12. The TIM, with the lid in place, may be cured at the same time as the overmold is cured, or after. The lid is typically in place before the TIM is cured so that adhesion develops between the TIM and the lid during curing. These operations are known in the art.

The sequence of steps shown in FIGS. 10-13 is recommended from the standpoint of simplicity, and represent a minimum departure from the standard method of attaching lids to IC packages having a chimney stack. However, using the conductive plugs creates an acceptable thermal path between the chimneys and the lid of the package. Accordingly, it is not necessary to use the conventional TIM. The lid may be attached by other means. For example, the lid may be attached using the methods described and claimed in application Ser. No. 11/504,989.

Figure 13:
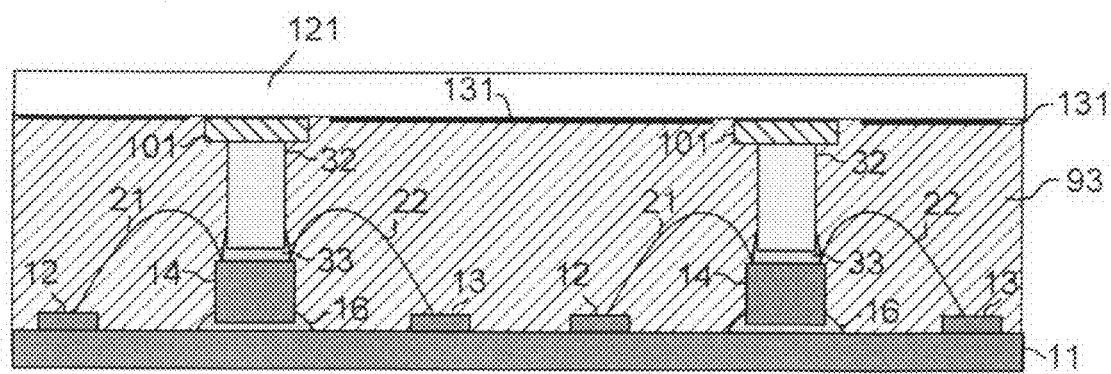
FIG. 13 shows an alternative method for attaching the lid to the package.

In another embodiment of the invention, the lid is attached using an adhesive polymer, such as an epoxy adhesive, that is selectively applied to the overmold. This option is illustrated in FIG. 13. Adhesive material 131 is selectively applied to the top of the overmold in regions spaced from the conductive plugs 101. The adhesive material may be applied as a liquid, gel, film, or other suitable application. This adhesive material may be thermally conductive or non-conductive. However, since the adhesive in these regions does not perform an essential thermal conducting function, it is preferably a non-conducting adhesive epoxy. As indicated above normal polymers have thermal conductivity values of approximately 0.2 W/mK. Accordingly, a polymer having a thermal conductivity below about 0.3 W/mK would be considered a non-conductive polymer. Moreover, since the adhesive polymer in this example does not cover the chimneys it is not necessary for it to conform to the mechanical properties recommended earlier for the conductive polymer plugs.

In the embodiments just described at least two different polymer materials are used in attaching the lid to the chimney stacks. One is an adhesive polymer, used to physically attach the lid to the overmold. The other is the conductive polymer forming the plugs between the chimneys and the lid. By using two materials, the mechanical properties of the materials can be tailored to the function required. The adhesive polymer material that bonds the lid to the package can be chosen for adhesive effectiveness, without regard to mechanical or even thermal properties. The other polymer material, the polymer that mechanically decouples the chimneys from the lid, can be optimized for mechanical and thermal properties.

As mentioned above, the invention is applicable primarily to MCM packages, which is intended to mean that each package contains N IC devices, where N is at least two, with each IC device being provided with a heat sink.

Various additional modifications of this invention will occur to those skilled in the art. All deviations from the specific teachings of this specification that basically rely on the principles and their equivalents through which the art has been advanced are properly considered within the scope of the invention as described and claimed.

The invention claimed is:

1. Method for the manufacture of an overmolded MCM IC package comprising:
   a. attaching N semiconductor IC devices to a substrate, where N is at least 2,
   b. attaching N heat sinks to the IC devices, with each IC device provided with a heat sink, the heat sinks having a bottom attached to an IC device, and a top,
   c. molding an overmold encapsulating the IC devices and the heat sinks, leaving the tops of the heat sinks exposed,
   e. applying a plurality of N plugs of a first polymer material selectively to the exposed tops of the heat sinks,
   f. applying a second polymer material to the surface of the overmold, and
   g. applying a lid to the second polymer material.

2. The method of claim 1 wherein first and second polymer materials are applied, the lid is applied, and then the first and second materials are cured in the same curing step.

3. The method of claim 1 wherein the IC devices are electrically connected to the substrate with wire bonds.

4. The method of claim 1 wherein the second polymer material is applied over the overmold and over the first polymer material.

5. The method of claim 1 wherein the first polymer material has a Tg lower than the Tg of the second polymer material.

6. The method of claim 5 wherein the first polymer material has an elastic modulus lower than the elastic modulus of the second polymer material.

7. The method of claim 1 wherein the first polymer material has a conductivity greater than 0.7 W/mK.

8. The method of claim 1 wherein the second polymer material has a conductivity less than 0.3 W/mK.

9. The method of claim 1 wherein the first conductive polymer is not an adhesive polymer.

* * * * *